United States Patent
Frerichs

(10) Patent No.: US 6,690,057 B1
(45) Date of Patent: Feb. 10, 2004

(54) EPROM STRUCTURE FOR A SEMICONDUCTOR MEMORY

(75) Inventor: Heinz-Peter Frerichs, St. Peter (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/676,630

(22) Filed: Sep. 30, 2000

(30) Foreign Application Priority Data

Sep. 30, 1999 (DE) .......................................... 199 46 884

(51) Int. Cl.[7] .............................................. H01L 29/788
(52) U.S. Cl. ....................... 257/315; 257/300; 257/681; 257/687
(58) Field of Search .................. 257/319, 677, 257/681, 667, 296, 300, 314, 315, 316

(56) References Cited

U.S. PATENT DOCUMENTS

| | | | | |
|---|---|---|---|---|
| 5,212,541 A | | 5/1993 | Bergemont | 257/319 |
| 5,243,559 A | * | 9/1993 | Murai | 365/185.27 |
| 5,352,619 A | * | 10/1994 | Hong | 437/43 |
| 5,471,422 A | * | 11/1995 | Chang et al. | 365/185.26 |
| 5,933,732 A | | 8/1999 | Lin et al. | 438/264 |
| 6,025,129 A | * | 2/2000 | Nova et al. | 435/6 |
| 6,075,293 A | * | 6/2000 | Li et al. | 257/382 |

* cited by examiner

Primary Examiner—Nathan J. Flynn
Assistant Examiner—Leonard Andújar
(74) Attorney, Agent, or Firm—Samuels, Gauthier & Stevens LLP

(57) ABSTRACT

An EPROM structure for a nonvolatile semiconductor memory includes a plurality of memory cells that each include a floating gate transistor (6) that can be programmed by hot electrons and erased by UV light. An additional, common gate capacitance (7) is associated with each memory cell to raise the potential at the floating gate transistor (6) to the level required for writing by applying to the gate capacitances a predetermined voltage, common to all the memory cells.

17 Claims, 2 Drawing Sheets

EPROM STRUCTURE FOR A SEMICONDUCTOR MEMORY

BACKGROUND OF THE INVENTION

The invention relates to an electronic memory device, and in particular an EPROM (erasable and programmable read-only memory) structure for a nonvolatile semiconductor memory with a plurality of memory cells, each of which has a floating gate transistor, which can be programmed by hot electrons and can be erased by UV light.

EPROM structures are used to build non-voltile semiconductor memories, especially for integrated circuits (embedded EPROM) and generally in computers or in microprocessor-controlled devices for storing programs and/or data that must be retained without a supply voltage.

Each memory cell of an EPROM structure generally has two transistors, namely a selection or access transistor that selects the memory cell, and a floating gate transistor, whose floating gate represents an erased or programmed state according to its positive or negative charge.

To program the memory cells, voltages of at least eight (8) volts are generally needed at the cell level and consequently voltages of about ten (10) volts for the pass gates. In the case of known EPROM structures, these voltages must be applied selectively to each memory cell that is to be programmed or erased. This implies a necessity for transistors that can switch these voltages. Since each memory cell must be selected, these transistors furthermore must be sufficiently small so that the entire structure and thus the memory will not become disproportionately large.

One problem is that conventionally produced integrated circuits as well as their production methods are designed for five (5) volts or less. For a conventional production process for integrated circuits to handle the high voltages necessary to embed EPROM structures, numerous additional process steps (generally about five to eight masking steps) are generally necessary. This makes the entire process and thus the integrated circuit substantially more expensive.

U.S. Pat. No. 5,212,541 discloses an EPROM structure, each of whose memory cells includes a floating gate transistor, which can be written (programmed) by hot electrons and erased by UV light. These memory cells can be rather easily manufactured with a known CMOS production processes. However, their disadvantage is that a voltage of thirteen (13) volts must be applied to a memory cell so as to program it selectively.

Therefore, there is a need for an EPROM structure that operates utilizing a voltage not much greater than 5 volts applied selectively to the individual memory cells.

SUMMARY OF THE INVENTION

Briefly, according to an aspect of the present invention, an EPROM structure includes a common gate capacitance disposed at each memory cell to raise the potential at the floating gate transistor to the level required for writing by applying to the gate capacitances a voltage, common to all the memory cells.

An advantage of this solution is that the common voltage does not need to be decoded. For this reason, high voltage transistors with other gate oxide thicknesses and diffusions are not necessary. This saves numerous mask and process steps in production, so that the electrical parameters of the standard transistors are not changed by additional process steps. On the other hand, voltages in excess of 20 volts can be present at the additional gate capacitance, since these need not be switched.

An economic advantage is that the production steps for the EPROM structure can be inserted without complication and without great expense into a conventional CMOS production process for integrated circuits.

The additional gate capacitance is preferably disposed above the floating gate of each memory cell. Furthermore, the floating gate transistor in particular is a depletion n-channel transistor, whose gate is charged negatively by hot electrons, so the floating gate transistor assumes an "off" state.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
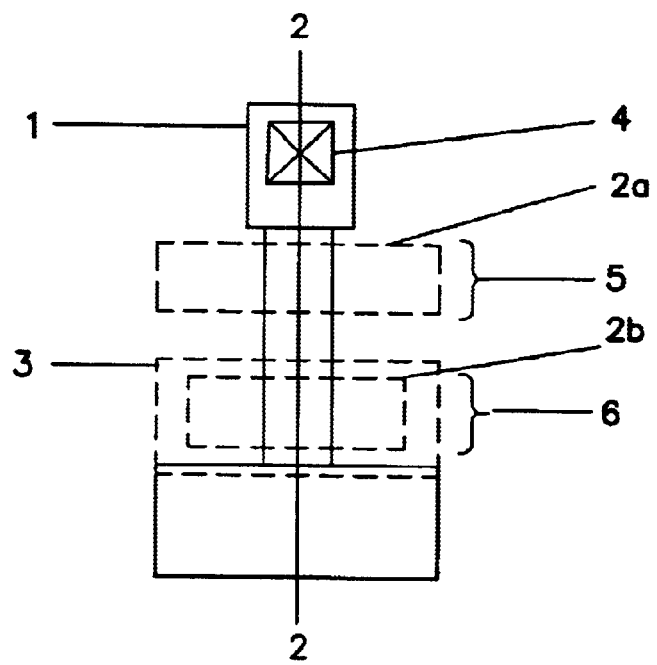
FIG. 1 illustrates a schematic top view of a memory cell according to the present invention.

As part of a preferred EPROM structure, FIG. 1 illustrates a top view of a memory cell with a floating gate transistor and an access transistor. This structure includes, in a substrate, an n-doped diffusion layer 1, which is contacted through a first metal contact 4. Next to this is a first poly-layer 2a, forming the access transistor 5. This is followed by a second poly-layer 2b, which creates the floating gate transistor 6. On this is situated a capacitance layer 3, forming the entire gate capacitance 7.

Figure 2:
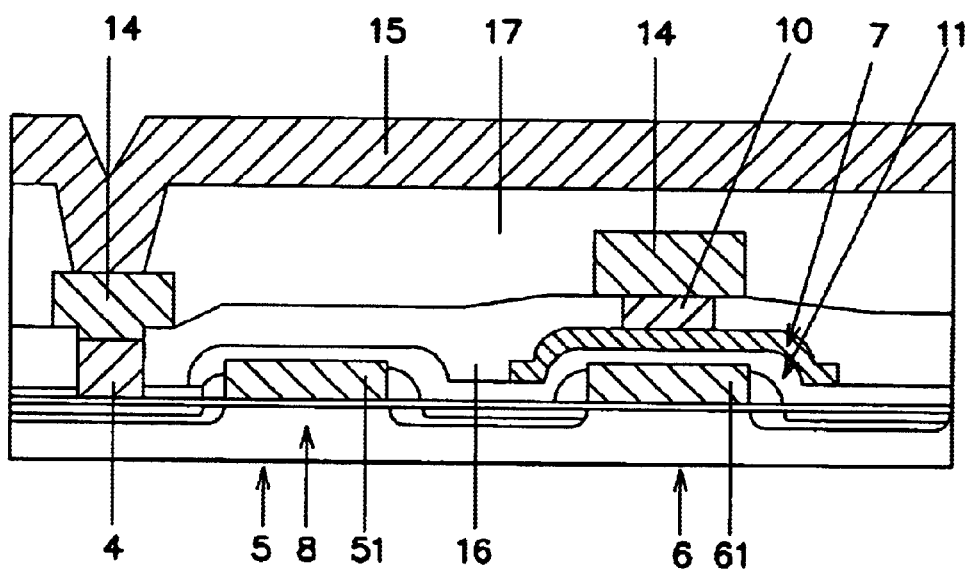
FIG. 2 illustrates a cross sectional view of the memory cell taken along the line A—A' in FIG. 1.

FIG. 2 illustrates a cross sectional view of the memory cell taken along the line A—A' in FIG. 1. The n-doped diffusion layers 1 are introduced into the p-substrate 8 by implantation. The first metal contact 4, a gate 51 of the access transistor 5. and a floating gate 61 of the floating gate transistor 6 are situated on the p-substrate. On the gate 51 as well as on the floating gate 61 is situated a first dielectric layer 11, which supports the common gate capacitance 7 in the region of the floating gate 61, and insulates it from the floating gate. A second dielectric layer 16 is deposited and holes are etched therein for the first metal contact 4 for the n-doped diffusion layer 1, and for a second metal contact 10 for the common gate capacitance 7 through known photolithographic techniques. To produce these contacts, the holes are filled with metal and a first metal layer 14 is applied thereon to make the contact. A third dielectric layer 17 is deposited into which holes are etched, and a second metal layer 15 is added for contacting the first metal layer 14. In one embodiment, gate capacitance 7 comprises a layer of silicon nitride about 30 nm thick. In another embodiment, gate capacitance 7 comprises a poly-layer about 50 nm thick. In a further embodiment, gate capacitance 7 comprises a titanium/titanium nitride layer about 30 nm thick.

Figure 3:
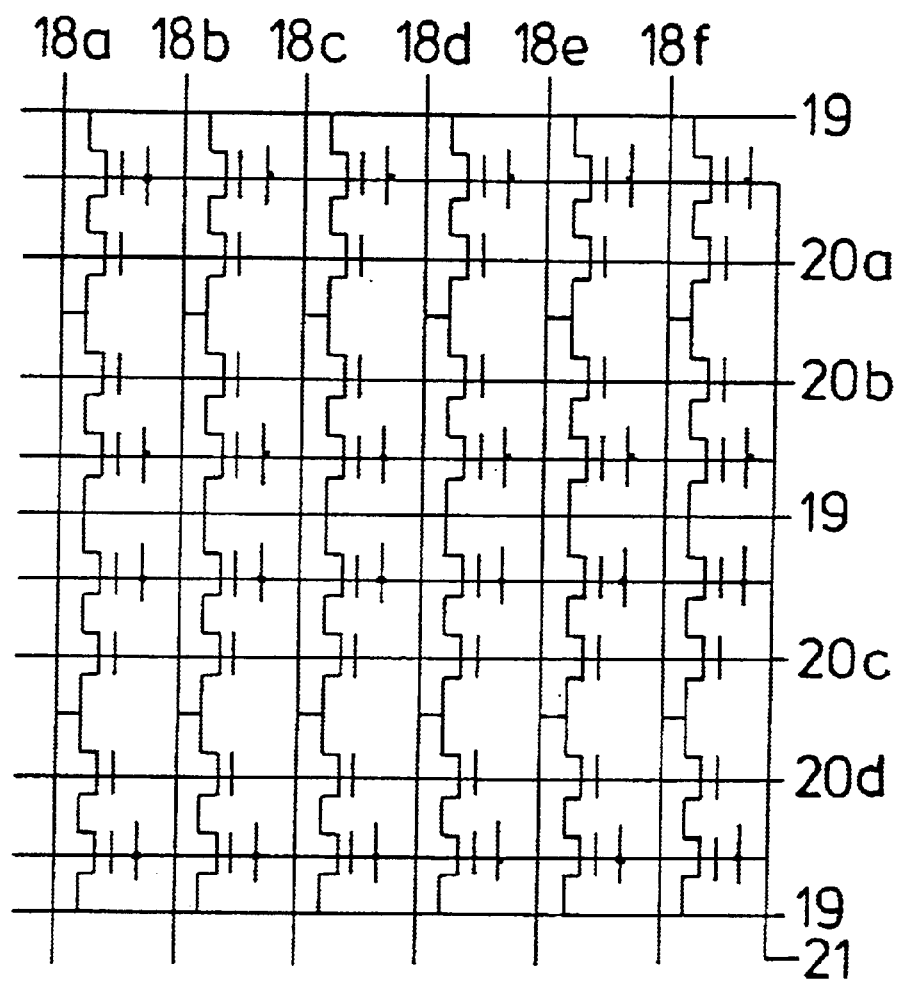
FIG. 3 illustrates an EPROM structure with a 6×4 bit memory cell arrangement.

FIG. 3 illustrates an electric circuit diagram for a 6×4 bit memory cell arrangement. The access transistors for selecting the individual memory cells are driven through first conductors 20a–20d. The second conductors 18a–18f represent bit conductors, and are connected to the EPROM memory cells through the access transistors. Two rows of memory cells share a source conductor 19. A programming conductor 21 is connected to the common gate capacitance 7 for all the memory cells. In this embodiment, the EPROM memory cell is a 2-transistor cell with a floating gate transistor, in the form of a depletion n-channel transistor. The potential rise needed for programming is produced by applying a voltage to the common gate capacitance. Depending on the thickness of the first dielectric layer 11 (FIG. 2) between the common gate capacitance 7 (FIG. 2) and the floating gate 61 (FIG. 2), a voltage between about 10 and 30 volts is applied through the programming conductors 21. The individual memory cells are addressed through one of the access conductors 20a–20d and through one of the bit conductors 18a–18f. The addressed cell has a drain voltage of Vdd and a source voltage, which is applied through the corresponding source conductor 19. The high positive potential at the common gate capacitance, which is applied through the programming conductor 21, pulls the hot electrons created on the drain side to the floating gate 61. The latter is thereby charged negatively, so that the floating gate transistor goes into the "off" state.

To read a memory cell, a voltage Vpp or 0 is applied to the programming conductor 21. The relevant cell is addressed through one of the bit conductors 18a–18f and one of the access conductors 20a–20d, and its current flow is detected. If the floating gate 61 is not charged, a current flows (signal "1"); on the other hand, if it is charged negatively, no current flows (signal "0").

To erase the memory cells, they are exposed to UV light, so that the charges on the floating gates are eliminated. Since the floating gate transistors are depletion n-channel transistors, they thereby assume the "one" state, such that a current flows and a signal value "1" is read.

An advantage of the invention is that a voltage in excess of 5 volts needs to be applied only to the common gate capacitance. This voltage can be applied in common for all the cells in the memory array, and thus does not need to be decoded. Consequently, no high voltage transistors are needed, for which different gate oxide thicknesses and diffusions would be necessary, so numerous masking and process steps can be saved. Furthermore, the electric parameters of the standard transistors are not changed by additional process steps. The voltages above 5 volts, which are needed for the additional capacitances, can be switched by MOS transistors such as are produced in every CMOS process. These are indeed relatively large, but in each instance only one of them needs to be present.

Although the present invention has been shown and described with respect to several preferred embodiments thereof, various changes, omissions and additions to the form and detail thereof, may be made therein, without departing from the spirit and scope of the invention.

What is claimed is:

1. An EPROM structure for a nonvolatile semiconductor memory, with a plurality of memory cells each memory cell comprising:
   a substrate;
   an access transistor formed in said substrate;
   a floating gate transistor formed in said substrate adjacent to said access transistor, wherein said floating gate transistor has a floating gate and can be programmed by hot electrons and erased by UV light;
   a first dielectric layer disposed over said access transistor and said floating gate transistor; and
   a common gate disposed over said portion of said dielectric layer disposed over said floating gate transistor so as to be located above at least the floating gate of said floating gate transistor to form a common gate capacitance, wherein each of said common gates of said memory cells are connected to a common programming conductor,
   wherein said common gate is structured and arranged over said portion of said dielectric layer over said floating gate transistor to provide said common gate capacitance so the potential at said floating gate transistor required for writing to each memory cell is substantially greater than the potential to read and erase the memory cell, and said common gate pulls hot electrons created on a drain side of said floating gate when a positive voltage potential is applied to said common gate.

2. The EPROM structure of claim 1, wherein said floating gate transistor comprises a depletion n-channel transistor having a gate configured to be charged negatively by hot electrons to assume an "off" state.

3. The EPROM structure of claim 1, wherein said common gate capacitance is disposed above only said floating gate of said floating gate transistor of each memory cell.

4. The EPROM structure of claim 3, wherein each said memory cell further comprises:
   a second dielectric layer deposited over said floating gate transistor and said access, transistor, said second dielectric layer having holes etched therein to receive a first metal contact for a source region of said access transistor, and a second metal contact for said common gate capacitance.

5. The memory device of claim 1, wherein said first dielectric layer comprises a layer of silicon nitride about 30 nm thick.

6. The memory device of claim 1, wherein said gate capacitance comprises a poly-layer about 50 nm thick.

7. The memory device of claim 1, wherein said gate capacitance comprises a titanium/titanium nitride layer about 30 nm thick.

8. The memory device of claim 1, wherein said first dielectric layer comprises a layer of silicon nitride at least 30 nm thick.

9. The memory device of claim 1, wherein said gate capacitance comprises a poly-layer at least 50 nm thick.

10. The memory device of claim 1, wherein said gate capacitance comprises a titanium/titanium nitride layer at least 30 nm thick.

11. A nonvolatile CMOS semiconductor memory device with at least one embedded EPROM that includes a plurality of memory cells, each of which comprises:
   a substrate;
   an access transistor formed in said substrate;
   a floating gate transistor formed in said substrate adjacent to said access transistor, wherein said floating gate transistor has a floating gate and can be programmed by hot electrons and erased by UV light;
   a first dielectric layer disposed over a floating gate transistor and said access transistor;
   a second dielectric layer deposited over said floating gate transistor and said access transistor, said second dielectric layer having holes etched therein to receive a first metal contact for a source region of said access transistor, and a second metal contact for said common gate capacitance;
   a common gate disposed over only said portion of said first dielectric layer disposed over said floating gate transistor so as to be located above at least the floating gate of said floating gate transistor to provide a common gate capacitance, wherein each of said common gates of said memory cells are connected to a common programming conductor; and wherein said first dielectric layer and said common gate are constructed and arranged such that the potential required to program the floating gate transistor is increased, and wherein said memory cells are configured such that said increased potential can be attained capacitively by applying a voltage to said common gate.

12. The memory device of claim 11, wherein said first dielectric layer comprises silicon nitride about 30 nm thick.

13. The memory device of claim 11, wherein said gate capacitance. comprises a poly-layer about 50 nm thick.

14. The memory device of claim 11, wherein said gate capacitance comprises a titanium/titanium nitride layer about 30 nm thick.

15. The memory device of claim 11, wherein each said memory cell further comprises:
   a first metal layer disposed over said second dielectric layer, etched so as to be separately contacting said first and second metal contacts.

16. The memory device of claim 15, wherein each said memory cell further comprises:
   a third dielectric layer disposed on said second dielectric layer, said third dielectric layer having holes etched therein to receive a first metal layer to contact said first and second metal contacts.

17. The memory device of claim 16, wherein each said memory cell further comprises:
   a second metal layer disposed on said third dielectric layer so as to contact said portion of said first metal layer that contacts said first metal contact.

* * * * *